United States Patent [19]
Massa et al.
[11] 3,937,991
[45] Feb. 10, 1976

[54] ELECTROACOUSTIC TRANSDUCERS OF THE BILAMINAR FLEXURAL VIBRATING TYPE AND METHOD FOR MANUFACTURING SAME

[75] Inventors: Frank Massa, Cohasset; Gilbert C. Barrow, Scituate, both of Mass.

[73] Assignee: Fred M. Dellorfano, Jr. and Donald P. Massa, Trustees of the Stoneleigh Trust, Cohasset, Mass.

[22] Filed: Dec. 8, 1971

[21] Appl. No.: 206,043

Related U.S. Application Data

[63] Continuation-in-part of Ser. No. 17,430, March 9, 1970, abandoned.

[52] U.S. Cl. .............. 310/9.1; 179/110 A; 310/8.2; 310/8.5; 310/8.6
[51] Int. Cl.[2] .......................................... H01L 41/04
[58] Field of Search ................ 310/8.2, 8.3, 9.1–9.4; 179/110 A

[56] References Cited

UNITED STATES PATENTS

| | | | |
|---|---|---|---|
| 2,409,838 | 10/1946 | Cress | 310/9.4 |
| 3,109,111 | 10/1963 | Wiggins | 310/8.2 |
| 3,268,855 | 8/1966 | Hagey | 310/8.2 X |
| 3,489,997 | 1/1970 | Morris | 340/15.5 |
| 3,518,460 | 6/1970 | Wood et al. | 310/8.2 |
| 3,654,402 | 4/1972 | Roos | 310/9.1 UX |

*Primary Examiner*—Mark O. Budd

[57] ABSTRACT

An electroacoustic transducer uses a bilaminar vibratile element having at least two plate members which are bonded together in face-to-face relationship, at least one of the plates being made from a piezoelectric material. The bilaminar plate is supported within a frame-like structure by resilient pads which attach the bilaminar plate at its nodal points to the surface of the supporting frame.

12 Claims, 6 Drawing Figures

ELECTROACOUSTIC TRANSDUCERS OF THE BILAMINAR FLEXURAL VIBRATING TYPE AND METHOD FOR MANUFACTURING SAME

This is a continuation-in-part of our copending U.S. patent application Ser. No. 17,430, filed Mar. 9, 1970, and assigned to the assignee of this invention (now abandoned).

Other related copending U.S. applications are "ELECTROACOUSTIC TRANSDUCERS OF THE BILAMINAR FLEXURAL VIBRATING TYPE," Ser. No. 81,842, filed Oct. 19, 1970, by Frank Massa, inventor, now U.S. Pat. No. 3,707,131, issued Dec. 26, 1972; and "ELECTROACOUSTIC TRANSDUCERS OF THE BILAMINAR FLEXURAL VIBRATING TYPE", Ser. No. 81,891, filed Oct. 19, 1970, by Gilbert C. Barrow, inventor, both of which are also assigned to the assignee of this invention.

This invention relates to electroacuoustic transducers and more particularly to transducers employing a resonant bilaminar plate operating at its fundamental resonant flexural mode of vibration.

The patent application describes a transducer employing a bilaminar flexural vibrating plate. The vibratile plate is suspended by flexible electrical ribbon conductors which are attached to opposite faces of the vibratile plate and extend beyond the edges of the plate, along mutually perpendicular axes. These ribbons are utilized for mounting the vibratile plate within an opening in a rigid frame-like member. The vibratile plate is flexibly suspended at its nodal points by the ribbon conductors for operating at its fundamental resonant mode of vibration.

The present invention provides an improvement in the construction of the transducer described in the co-pending application. The improvement eliminates the ribbon conductors from the assembly, which results in a lower manufacturing cost and provides a construction which achieves more uniform and stable operating characteristics throughout the operating life of the transducer.

Accordingly, an object of this invention is to provide a new and efficient, low cost electroacoustic transducer utilizing a bilaminar plate operating at a fundamental, free resonant mode.

A further object of this invention is to suspend a bilaminar piezoelectric vibratile transducer element within a frame-like mounting structure, without imposing mechanical restraints at the fundamental resonant mode of vibration.

Yet another object of this invention is to mount a piezoelectric bilaminar square plate within a clearance opening provided in a frame-like structure. Here an object is to use small elastic pads to attach the center point of each edge of the square vibratile plate to the edge of the frame-like opening within which the vibratile plate is mounted.

An additional object of this invention is to provide a method of manufacture which enables an assembly of a square bilaminar vibratile element which is accurately positioned within a clearance opening in a supporting frame-like structure.

A still further object of this invention is to provide a unitary mounting structure for a bilaminar transducer element, which achieves a low cost assembly and simultaneously results in a high degree of uniformity in the operating characteristics of mass produced quantities of transducers.

Still another object of this invention is to provide a very simple mounting and housing structure for a bilaminar piezoelectric plate in order to achieve an efficient operation at its fundamental resonant frequency mode of vibration.

In keeping with an aspect of this invention, a small spot of a viscous fluid is applied to bridge the gaps between the nodal points around the periphery of a square vibratile plate and the nearby edges of an opening in the supporting frame-like member, within which the vibratile plate is located. The viscous fluid has the property of curing into a flexible rubber-like solid after it is applied to the assembly. Or, according to another aspect, a resilient rubber-like support member is provided with an opening which is larger than the size of a vibratile plate member mounted within said opening. This rubber-like support member has small tabs integrally extending radially inward from the wall of the opening toward the center of the opening. The extension tabs include notches for locating and retaining the center nodal regions along the edges of the vibratile plate, which is adapted to fit snugly into the notched resilient tabs. According to either of these aspects, the vibratile plate floats freely and without restraint.

Other objects, features and advantages will become more apparent from the following description when taken in conjunction with the accompanying drawings in which.

Figure 1:
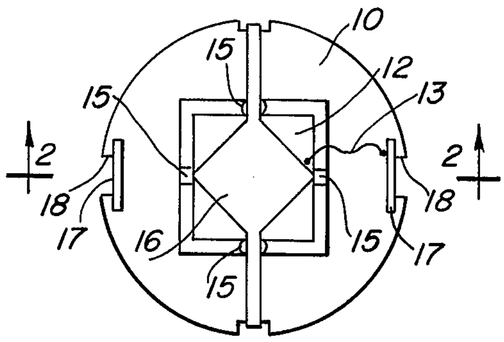
FIG. 1 is a plan view of one embodiment of the invention with the outer housing removed.

In the FIGS. the reference character 10 designates a rigid flat plate preferably made of an electrical insulation material, such as Bakelite. A square piezoelectric bilaminar plate assembly 12 is suspended within a square opening formed in the center of the rigid plate.

the bilaminar plate 12 could take either of two forms. In one form, the plate may include a pair of polarized piezoelectric ceramic elements such as barium titanate or lead zirconate titanate, for example. Alternatively, other suitable piezoelectric materials may also be used, as is well known in the art. Metallized electrodes are formed on the opposite surfaces of the two piezoelectric elements. The bilaminar plates are arranged with their common potential surfaces bonded together in face-to-face relationship. In the second form, the bilaminar assembly 12 could also include an inert plate such as aluminum which has a piezoelectric element bonded thereto. However, it should be understood that other inert materials could also be used. The elements 10 and 12 are similar to the elements 10 and 12 shown in FIG. 1 of copending application Ser. No. 17,430, filed Mar. 9, 1970.

Electrical conductors 13 and 14 are conductively bonded to the opposite exposed electrode surfaces of the bilaminar plate assembly. The conductive bond may be made by soldering, by welding, or by any other suitable means. The conductors 13 and 14 are attached to the electrodes near the center points along a side of the square bilaminar element. These points are in the nodal regions of the vibratile plate assembly, when it operates at its fundamental resonant frequency mode.

The vibratile plate 12 is held in position within the square opening of the plate member 10 by four spots of rubber-like elastic material 15. One satisfactory method for assemblying the plate structure is to locate the piezoelectric plate 12 concentrically within the opening in support plate 10. While holding the two plates in a fixed relationship, a small quantity of a viscous fluid is applied at each of the four nodal points to fill the gaps between the piezoelectric plate assembly and the peripheral walls of the window opening of the plate 10. The viscous fluid has the property of becoming a flexible rubber-like solid after it is cured. One of the suitable materials is a silicone rubber compound commonly sold under the trademark "SILASTIC." Other similar materials or potting compounds, which may be applied as a viscous fluid and subsequently cured and converted to a flexible rubber-like consistency may also be used.

Figure 2:
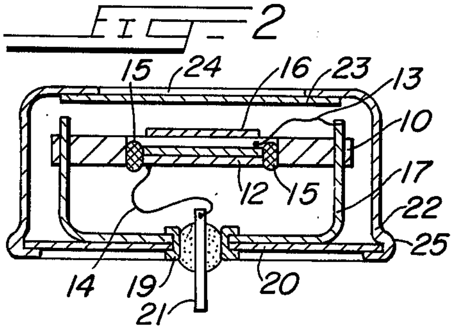
FIG. 2 is a cross-sectional view taken along the line 2–2 of FIG. 1 (with the outer housing in place)

Although not absolutely essential to the operation of this transducer, it is preferable to make the support plate member 10 thicker than the thickness of the bilaminar piezoelectric plate 12. Then, during assembly, the bottom surface of the plate member 12 may be aligned with the bottom surface of the support plate member 10, such as by placing both plate members on a flat reference surface. This procedure simplifies the assembly process by holding the surfaces in alignment during the application of the elastic spots 15. When the spots 15 have cured to form the resilient suspension members, a clearance space exists between the top surface of the bilaminar piezoelectric plate 12 and the top surface of the support plate member 10, as illustrated in the view of FIG. 2. This clearance space prevents a sound opaque mask 16 from coming in contact with the vibrating ceramic element 12.

By the procedure just described, the vibratile piezoelectric plate 12 is held by the four flexible, resilient spots 15. The plate 12 is free to vibrate at its fundamental resonant mode without restraint or loss of mechanical energy. When conductors 13 and 14 are energized by an alternating voltage of a frequency corresponding to the fundamental flexural resonant frequency of the plate 12, the four corners of the square bilaminar ceramic plate 12 vibrate together in phase. All four corners move opposite in phase to the movement at the center area of the bilaminar elements.

To improve the radiating efficiency of the transducer, the sound opaque mask 16 is suspended over the center portion of the bilaminar piezoelectric element 12. The opaque mask prevents the out-of-phase radiation from the center area of the bilaminar plate from neutralizing the radiation from the four corners of the element. The outline contours of the opaque mask 16 follow the shape of the nodal line on the surface of the piezoelectric plate 12. Thus, the area of the mask is about one-half the area of the piezoelectric element. Therefore, only the four corners of the piezoelectric element 12 remain exposed to the surrounding medium, as illustrated in FIG. 1. The mask 16 may be made from any suitable sheet of metal or plastic which is sufficiently thick to remain practically stationary during the operation of the transducer.

To complete the transducer assembly, a U-shaped metal bracket 17 is notched at the tips of the arms forming the U. The notch locks into mating slots 18 at the periphery of the plate 10, as shown in FIGS. 1 and 2. At its base, an eyelet 19 attaches the bracket 17 to a metal lid 20. The eyelet 19 is part of the insulated terminal 21 to which the lead 14 is soldered. The conductor 13 is soldered to the surface of the U bracket 17. Thus, the complete electrical circuit extends from the eyelet 19 through bracket 17, conductor 13, the element 12, conductor 14, and the pin 21.

A cup-shaped metallic housing 22 has a protective screen 23 welded or cemented therein to cover an open surface 24. The open lip of the cup housing 22 is crimped at 25 over the edge of the lid 20 to complete the outer shell of the transducer. For operating the transducer, electrical connections are made to external equipment via the terminal 21 and metallic plate 20.

The transducer described thus far is identical in its operation with the transducer shown in FIGS. 1 and 2 of the copending application Ser. No. 17,430. The only difference lies in the mounting for the piezoelectric plate. In the previous invention, ribbon electrode leads were used for suspending the piezoelectric ceramic plate. These ribbons have been eliminated in the present invention, and the piezoelectric ceramic plate is now attached by means of the elastic spots 15.

Figure 3:
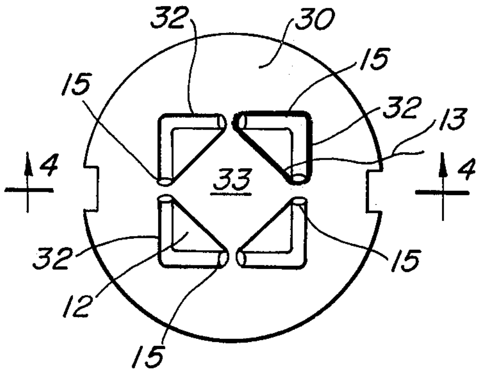
FIG. 3 is a plan view of another embodiment of the inventive transducer element assembly which uses fewer parts as compared to the number of elements used in the assembly of FIG. 1.
Figure 4:
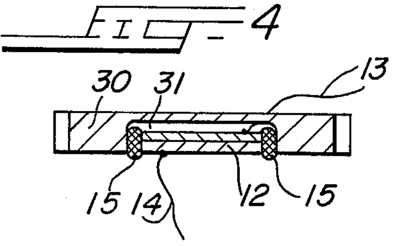
FIG. 4 is a cross-sectional view taken along the line 4—4 of FIG. 3.

A second embodiment of the transducer element assembly is shown in FIGS. 3 and 4. In this embodiment, a single molded piece of rigid plastic 30 provides a flat plate structure with a square cavity 31 partly recessed in the bottom thereof, as shown in FIG. 4. The plane surface inside cavity 31 and on the bottom of the plate 30 forms a closure at the base of the cavity 31. The four corner sections of this plate are perforated or pierced to form four approximately right triangular openings 32, as shown in the plan view of FIG. 3. One of these four openings is outlined by heavily inked lines, for easy identification.

The four corners of the piezoelectric ceramic plate 12 may be seen through the four perforated corners 32 (FIG. 3). Conductors 13 and 14 are attached to the vibrating piezoelectric plate member 12 in the same fashion as was described in connection with FIGS. 1 and 2. The plate 12 is located within the square recess provided in the molded plastic piece 30, and the resilient spot members 15 are applied for holding the vibratile piezoelectric plate 12 in place, as was described in connection with FIGS. 1 and 2. In the perforated base portion of the cavity 31, the solid center section 33 serves the same function as the masking plate 16 of FIGS. 1 and 2. After completing the assembly of FIGS. 3 and 4, it may be supported, as by the U-shaped bracket 17 in FIG. 2, for example.

Figure 5:
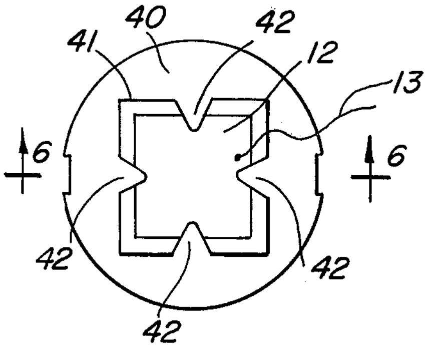
FIG. 5 is a plan view of still another embodiment of the inventive transducer element assembly which employs a resilient structural frame member for holding the bilaminar plate assembly.
Figure 6:
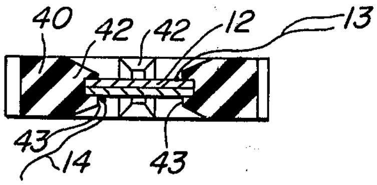
FIG. 6 is a cross-sectional view taken along the line 6—6 of FIG. 5.

FIGS. 5 and 6 show another embodiment of the transducer element assembly, using small resilient spot support members for mounting the nodal points of the square bilaminar vibratile piezoelectric plate. In this embodiment, the support plate is a molded rubber member 40, which includes a square opening 41 through its center. Midway along each edge of the square opening a triangular-shaped tip 42 protrudes. A rectangular notch 43 is recessed into each tip 42, (FIG. 6) to hold the vibratile piezoelectric plate 12 in place after it is inserted within the notches. The insertion may be accomplished by stretching the rubber disc member 40 until the tip members 42 clear the width dimension of the piezoelectric plate 12. Then the rubber member 40 is allowed to snap back to its original dimension to secure the vibratile plate 12 in place, as illustrated in FIGS. 5 and 6. The construction shown in FIGS. 5 and 6 provides a resiliennt nodal point suspension for the vibratile piezoelectric plate 12 without the necessity of separately applying the spots of resilient material 15, as described above in the constructions of FIGS. 1–4.

The operation of the transducer herewith described is the same as the operation described in the previously referenced copening parent application, wherein the specific relationships were also given for the preferred ratios of thickness to periphery dimensions for the vibratile element 12, in order that the vibrational resonance mode of the plate may be established without undue mechanical restriction or loss of efficiency.

While several specific embodiments of the present invention have been shown and described, it should be understood that the appended claims are to be construed to cover all equivalent structures which do not depart from the true spirit and scope of the invention.

I claim:

1. An electroacoustic transducer comprising a bilaminar vibratile element having at least two plate members bonded together in face-to-face relationship, at least one of said bonded plates being piezoelectric material with electrode surfaces thereon, electrical conductor means connected to said electrode surfaces, vibratile plate mounting means comprising a structural support member having an opening therein for receiving said vibratile plate with a space separating the entire periphery of the plate and the support, flexible rubber-like support means for attaching said bilaminar vibratile element to said structural support member, said vibratile element having flexural vibrations responsive to an application of alternating voltage to said electrical conductors, said flexible support means comprising a plurality of resilient spot members spanning said peripheral space between the plates and said support member for holding said vibratile element in a predetermined spacial relationship without any direct contact with said structural support member, said resilient spot members being attached to said vibratile element in the vicinity of the nodal points established in said vibratile element when said vibratile element is operating at its fundamental resonant frequency mode of vibration.

2. The invention in claim 1 wherein said bilaminar vibratile element is approximately square and said structural support member includes a frame-like portion having an opening within which said square bilaminar vibratile element may be freely suspended, said resilient spot members being attached between said nodal points which are established near the center of each side of said square vibratile bilaminar plate member during its fundamental resonant mode of vibration and the proximate edges of said frame-like structural portion which surrounds said vibratile plate.

3. The invention in claim 2 wherein said resilient spot members comprise elastic bridge members attached between the center nodal points of the peripheral edges of said vibratile square plate and the proximate edges of said surrounding frame-like opening in said structural portion.

4. An electroacoustic transducer comprising an approximately square bilaminar vibratile plate member including at least two plate members bonded together in face-to-face relationship, at least one of said bonded plates being a piezoelectric material with electrode surfaces, means comprising a structural frame member having an opening larger than said vibratile plate member for supporting said vibratile plate within said opening with a peripheral space completely surrounding the plate and separating it from the support, and means comprising a rubber-like resilient spot member spanning said peripheral space near the center at the fundamental node point of each side of said vibratile plate member for attaching it to the proximate edge of said structural frame member whereby said vibratile plate member is secured in an operating position within said frame member, said resilient member having a characteristic which does not change as a function of the excursion of the plate.

5. The invention in claim 4 wherein said structural frame member is a rigid plate having a thickness which is greater than the thickness of said bilaminar vibratile element.

6. The invention in claim 5 wherein said resilient spot members comprise bridge members attached between the center points of the edges of said vibratile plate and the proximate edges of said surrounding frame-like structural portion.

7. The invention in claim 5 wherein one surface of said bilaminar vibratile element lies in approximately the same plane as one surface of said rigid structural frame member.

8. The invention in claim 7 wherein said resilient spot members comprise elastic bridge members attached between the center point of the edges of said vibratile square plate and the proximate edges of said frame-like structural portion.

9. The invention in claim 4 wherein said structural frame member is of an elastic material.

10. The invention in claim 9 wherein said resilient spot members are an integral part of said structural frame member.

11. An electroacoustic transducer comprising an approximately square bilaminar vibratile plate member having at least two members bonded together in face-to-face relationship, at least one of said bonded plates being a piezoelectric material with electrode surfaces, means comprising a rigid structural plate member having a thickness which is greater than the thickness of said bilaminar vibratile plate member, a square cavity recessed into one surface of said structural plate member, the depth of said cavity being greater than the thickness of said vibratile plate member and less than the thickness of said structural plate member whereby a solid wall remains as a closure to the recessed cavity, said wall surface being perforated with triangular openings at each corner of said recessed closure, the hypotenuse of said triangles being arranged to leave a solid diamond-shaped center portion of said closure wall surface as in integral part of said structural plate member, said vibratile plate member being located within said recessed cavity with clearance spaces between the periphery of said vibratile plate member and the surrounding edges of said recessed square cavity and a clearance space between the flat surface of said vibratile plate member and the diamond-shaped recessed surface facing said bilaminar plate when said bilaminar plate is in said recessed cavity, and resilient spot members attached between the center points of the peripheral edges of said vibratile plate member and the proximate edges of said square recessed cavity in said structural plate member.

12. An electroacoustic transducer comprising an approximately square bilaminar vibratile plate member including at least two plate members bonded in face-to-face relationship, at least one of said bonded plates being a piezoelectric material with electrode surfaces, support means comprising an elastic structural frame member made of resilient material and having a square opening which is larger than said vibratile plate member, said square vibratile plate member being located within said square opening, integral projecting tabs extending inward from the inner peripheral wall of said opening toward the center of the opening, notches provided in the free ends of said extension tabs, said notches being dimensioned to enable the assembly and snug retention of said square vibratile plate therein in operative relationship within said elastic structural frame member.

* * * * *